United States Patent
Koduma et al.

(10) Patent No.: US 10,947,425 B2
(45) Date of Patent: Mar. 16, 2021

(54) ADHESIVE

(71) Applicant: DAICEL CORPORATION, Osaka (JP)

(72) Inventors: Hiroyoshi Koduma, Himeji (JP); Hiroki Tanaka, Himeji (JP)

(73) Assignee: DAICEL CORPORATION, Osaka (JP)

( * ) Notice: Subject to any disclaimer, the term of this patent is extended or adjusted under 35 U.S.C. 154(b) by 180 days.

(21) Appl. No.: 15/766,250

(22) PCT Filed: Oct. 4, 2016

(86) PCT No.: PCT/JP2016/079457
§ 371 (c)(1),
(2) Date: Apr. 5, 2018

(87) PCT Pub. No.: WO2017/061416
PCT Pub. Date: Apr. 13, 2017

(65) Prior Publication Data
US 2019/0119534 A1 Apr. 25, 2019

(30) Foreign Application Priority Data

Oct. 9, 2015 (JP) .............................. JP2015-200836

(51) Int. Cl.
| | |
|---|---|
| *C08L 29/10* | (2006.01) |
| *C08J 5/18* | (2006.01) |
| *C09J 11/06* | (2006.01) |
| *C09J 11/08* | (2006.01) |
| *C09J 201/06* | (2006.01) |
| *C09J 4/06* | (2006.01) |
| *C09J 7/30* | (2018.01) |
| *C09J 167/00* | (2006.01) |
| *C09J 177/00* | (2006.01) |
| *C09J 129/10* | (2006.01) |
| *C09J 175/00* | (2006.01) |
| *C09J 129/14* | (2006.01) |

(52) U.S. Cl.
CPC .............. *C09J 11/06* (2013.01); *C08J 5/18* (2013.01); *C08L 29/10* (2013.01); *C09J 4/06* (2013.01); *C09J 7/30* (2018.01); *C09J 11/08* (2013.01); *C09J 129/10* (2013.01); *C09J 167/00* (2013.01); *C09J 175/00* (2013.01); *C09J 177/00* (2013.01); *C09J 201/06* (2013.01); *C08J 2300/22* (2013.01); *C08J 2329/14* (2013.01); *C08J 2367/00* (2013.01); *C08J 2375/04* (2013.01); *C08J 2377/00* (2013.01); *C09J 129/14* (2013.01); *C09J 2203/326* (2013.01); *C09J 2301/502* (2020.08); *C09J 2400/22* (2013.01); *C09J 2467/00* (2013.01); *C09J 2475/00* (2013.01); *C09J 2477/00* (2013.01)

(58) Field of Classification Search
None
See application file for complete search history.

(56) References Cited

U.S. PATENT DOCUMENTS

| | | | |
|---|---|---|---|
| 4,617,354 A | 10/1986 | Augustin et al. | |
| 2011/0048638 A1* | 3/2011 | Shinoda | .................... B32B 7/12 156/309.6 |
| 2016/0264822 A1 | 9/2016 | Ito et al. | |

FOREIGN PATENT DOCUMENTS

| | | |
|---|---|---|
| CN | 101821352 A | 9/2010 |
| JP | 60-179479 A | 9/1985 |
| JP | 2007-186630 A | 7/2007 |
| JP | 2008-49443 A | 3/2008 |
| JP | 2011-12098 A | 1/2011 |
| JP | 2011-225814 A | 11/2011 |
| JP | 5074715 B2 | 11/2012 |
| JP | 5074716 B2 | 11/2012 |
| JP | WO2015/053223 A1 | 3/2017 |
| TW | 200930781 A | 7/2009 |
| WO | WO 2012/133142 A1 | 10/2012 |
| WO | WO 2015/053223 A1 | 4/2015 |

OTHER PUBLICATIONS

Extended European Search Report, dated Apr. 25, 2019, for counterpart European Application No. 16853570.6.
International Search Report for PCT/JP2016/079457 dated Nov. 1, 2016.
Written Opinion of the International Searching Authority for PCT/JP2016/079457 (PCT/ISA/237) dated Nov. 1, 2016.

(Continued)

*Primary Examiner* — Frank D Ducheneaux
(74) *Attorney, Agent, or Firm* — Birch, Stewart, Kolasch & Birch, LLP.

(57) ABSTRACT

Provided is an adhesive as follows. The adhesive can bond/secure an adherend to a support with maintaining high adhesiveness during the existence of the need for securing of the adherend to the support, even in a high-temperature environment or in an environment with abrupt temperature change. The adhesive enables debonding of the adherend from the support without breakage of the adherend when the securing becomes unnecessary. The adhesive can be easily removed when remained on the adherend after debonding. The adhesive according to the present invention contains (A) a multivalent vinyl ether compound, (B) a compound including two or more of a constitutional unit represented by Formula (b), and (C) a thermoplastic resin. In the formula, X is selected from hydroxy and carboxy.

[Chem. 1]

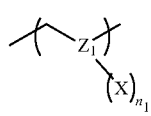

(b)

15 Claims, No Drawings

(56) References Cited

OTHER PUBLICATIONS

"Omona Plastic no Tokusei to Yoko", The Japan Plastics Industry Federation, online, Mar. 14, 2015, retrieval date Oct. 24, 2016, 1 page, Internet <URL:http://www.jpif.gr.jp/2hello/conts/youto.pdf> with an Engiish translation.
Taiwanese Office Action and Search Report for Taiwanese Application No. 105132372 dated Sep. 7, 2020.
Chinese Office Action and Search Report, dated May 8, 2020, for corresponding Chinese Application No. 201680059021.8, with an English translation.

* cited by examiner

ADHESIVE

CROSS-REFERENCE TO RELATED APPLICATIONS

The present application is a national phase under 35 U.S.C. § 371 of PCT International Application No. PCT/JP2016/079457, which has an International filing date of Oct. 4, 2016, which claims priority of Application No. 2015-200836 filed in Japan on Oct. 9, 2015, under 35 U.S.C. § 119, the entire contents of which are hereby incorporated by reference.

TECHNICAL FIELD

The present invention relates to an adhesive that is used for temporarily securing an adherend such as a semiconductor wafer. This application claims priority to Japanese Patent Application No. 2015-200836, filed to Japan on Oct. 9, 2015, the entire contents of which are incorporated herein by reference.

BACKGROUND ART

Semiconductor chips are more and more reduced in size and thickness, and three-dimensionally integrated so as to achieve advantages such as reduction in size and weight, high-functionalization, and more efficient power consumption. Such semiconductor chips are produced by forming a circuit pattern on a wafer, grinding the wafer to be thin, and dicing the thinned wafer. However, the wafer after thinning is very fragile and is susceptible to breakage typically when the wafer is subjected to processing such as grinding or dicing and when the wafer is transported. To eliminate or minimize this, the wafer is processed and transported while being temporarily secured to, and thereby protected by, a support (carrier).

In a conventionally known technique, a waxy adhesive has been used for temporarily securing such wafers (Patent Literature (PTL) 1). Disadvantageously, however, the waxy adhesive has a low softening point, and this causes the adhesive to flow and move and impedes the securing of the wafer in a high-temperature process such as film deposition by vapor deposition and transfer from the temporary-securing substrate (support) to a wafer for integration. Another known technique employs a heat-sensitive adhesive including a pressure-sensitive adhesive and a side-chain crystalline polymer (PTL 2 and PTL 3). Also disadvantageously, however, the heat-sensitive adhesive flows and moves in a high-temperature process, and this impedes the securing of the wafer. According to yet another known technique, an adhesive is cured, contracted, and deformed by the application typically of ultraviolet rays to debond the adhesive from a wafer. In this technique, disadvantageously, the wafer is susceptible to breakage due to stress upon debonding.

CITATION LIST

Patent Literature

PTL 1: Japanese Unexamined Patent Application Publication (JP-A) No. 2008-49443
PTL 2: Japanese Patent No. 5074715
PTL 3: Japanese Patent No. 5074716

SUMMARY OF INVENTION

Technical Problem

The inventors of the present invention found an adhesive containing a multivalent vinyl ether compound and a compound containing two or more groups selected from hydroxy and carboxy, and found that: this adhesive, when heated, undergoes polymerization of the multivalent vinyl ether compound, through acetal bonding, with the compound containing two or more groups selected from hydroxy and carboxy and can give a thermoplastic polymer having a softening point in a high-temperature range; that the adhesive, when solidified thereafter, can secure an adherend with excellent adhesiveness even in a high-temperature environment; and that, when securing of the adherend becomes unnecessary, the adhesive can be debonded (removed) from the adherend without applying stress to the adherend, by heating at a temperature equal to or higher than the softening point of the polymer, because a solidified product of the adhesive is abruptly softened or liquefied upon the heating to have lower adhesiveness or to lose adhesiveness.

Disadvantageously, however, the solidified product of the adhesive has poor flexibility, and this may cause spontaneous debonding of the adherend due to abrupt temperature change, or may cause the solidified product of the adhesive to crack to thereby have lower adhesive strength.

In addition, the adhesive is insufficient in washability of residual adhesive (adhesive residue) remaining on the adherend after debonding.

Accordingly, the present invention has an object to provide an adhesive as follows. While securing of an adherend to a support is required, the adhesive can maintain high adhesiveness and can bond/secure the adherend to the support even in a high-temperature environment and in an environment in which the temperature changes abruptly. The adhesive enables debonding of the adherend from the support when the securing becomes unnecessary, and can be easily removed when it remains on the adherend after debonding.

The present invention has another object to provide a method for temporarily securing an adherend using the adhesive.

The present invention has yet another object to provide a method for processing an adherend using the adhesive.

The present invention has still another object to provide an adhesive film formed from the adhesive.

Solution to Problem

After intensive investigations to achieve the objects, the inventors have following findings:
1) that, when a thermoplastic resin is further combined with an adhesive containing a multivalent vinyl ether compound and a compound containing two or more groups selected from hydroxy and carboxy to give an adhesive, the resulting adhesive has a low softening point and offers excellent coatability;
2) that the adhesive, when subjected to a heat treatment, can give a thermoplastic polymer having a softening point in a high-temperature range, because the multivalent vinyl ether compound and the compound containing two or more groups selected from hydroxy and carboxy form a crosslinked structure through acetal bonding;

3) that the thermoplastic polymer can maintain excellent adhesiveness at a temperature lower than the softening point, namely, that the thermoplastic polymer can maintain excellent adhesiveness even in a high-temperature environment;

4) that the combining of a thermoplastic resin can impart flexibility to a solidified product of the adhesive, that this can protect the solidified product of the adhesive from spontaneous debonding and cracking even in an environment with abrupt temperature change, and allows the solidified product to maintain excellent adhesiveness; and 5) that the solidified product of the adhesive including the thermoplastic polymer, when heated at a temperature equal to or higher than the softening point of the polymer, is abruptly softened or liquefied to have lower adhesiveness or to lose adhesiveness, this allows the adherend to be debonded without receiving stress, and an adhesive residue, when remaining on the adherend after debonding, can be easily removed by washing.

The present invention has been made on the basis of these findings.

Specifically, the present invention provides, in an embodiment, an adhesive including (A) a multivalent vinyl ether compound (A), (B) a compound including two or more of a constitutional unit represented by Formula (b), and (C) a thermoplastic resin, where Formula (b) is expressed as follows:

[Chem. 1]

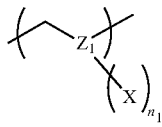

(b)

wherein $Z_1$ represents a group resulting from removing $(n_1+2)$ hydrogen atoms from the structural formula of a compound selected from a saturated or unsaturated aliphatic hydrocarbon, a saturated or unsaturated alicyclic hydrocarbon, an aromatic hydrocarbon, a heterocyclic compound, and a compound including two or more of these compounds bonded to each other through a single bond or a linkage group; X is, independently in each occurrence, selected from hydroxy and carboxy; and $n_1$ represents an integer of 1 or more, where $n_1$ occurrences of X may be identical to or different from each other.

In the adhesive, the multivalent vinyl ether compound (A) may be a compound represented by Formula (a):

[Chem. 2]

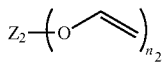

(a)

wherein $Z_2$ represents a group resulting from removing $n_2$ hydrogen atoms from the structural formula of a compound selected from a saturated or unsaturated aliphatic hydrocarbon, a saturated or unsaturated alicyclic hydrocarbon, an aromatic hydrocarbon, a heterocyclic compound, and a compound including two or more of these compounds bonded to each other through a single bond or a linkage group; and $n_2$ represents an integer of 2 or more.

In the adhesive, the compound (B) may have a weight-average molecular weight of 1500 or more, as determined by GPC and calibrated with a polystyrene standard.

In the adhesive, the thermoplastic resin (C) may be at least one compound selected from the group consisting of poly (vinyl acetal) resins, polyester resins, polyurethane resins, and polyamide resins.

In the adhesive, the thermoplastic resin (C) may have a weight-average molecular weight of 1500 or more, as determined by GPC and calibrated with a polystyrene standard.

The adhesive may contain the components in amounts within ranges as follows:

the multivalent vinyl ether compound (A) is present in such an amount that the amount of vinyl ether group in the multivalent vinyl ether compound (A) is 0.01 to 10 moles per mole of the totality of hydroxy group and carboxy group in the compound (B);

the thermoplastic resin (C) is present in an amount of 0.1 to 3 parts by weight per 1 part by weight of the compound (B); and the multivalent vinyl ether compound (A), the compound (B), and the thermoplastic resin (C) are present in combination in a total content of 70 to 99.9 weight percent of the totality of non-volatile components in the adhesive.

The adhesive may further contain at least one of a monovalent carboxylic acid represented by Formula (d) and a monohydric alcohol represented by Formula (e), where Formulae (d) and (e) are expressed as follows:

$$Z_3\text{—COOH} \quad (d)$$

wherein $Z_3$ represents a group resulting from removing one hydrogen atom from the structural formula of a compound selected from the group consisting of saturated or unsaturated aliphatic hydrocarbons, saturated or unsaturated alicyclic hydrocarbons, and aromatic hydrocarbons, each of which may have one or more substituents excluding carboxy, $$Z_4\text{—OH} \quad (e)$$

wherein $Z_4$ represents a group resulting from removing one hydrogen atom from the structural formula of an aromatic hydrocarbon which may have one or more substituents excluding hydroxy.

The adhesive may further contain an antioxidant in an amount of 0.01 to 15 parts by weight per 100 parts by weight of the totality of the compound (B) and the thermoplastic resin (C).

The present invention also provides, in another embodiment, a method for temporarily securing an adherend to a support using an adhesive. The method includes a securing step and a debonding step. In the securing step, the above-mentioned adhesive is subjected to a heat treatment to form a polymer between the multivalent vinyl ether compound (A) and the compound (B) each contained in the adhesive, and the adhesive is then solidified to secure the adherend to the support. In the debonding step, the solidified adhesive is subjected to a heat treatment at a temperature equal to or higher than the softening point of the polymer to soften or liquefy the adhesive to thereby debond the adherend from the support.

The present invention also provides, in yet another embodiment, a method for processing an adherend while being temporality secured to a support using an adhesive. The method includes a securing step, a processing step, and a debonding step. In the securing step, the above-mentioned adhesive is subjected to a heat treatment to form a polymer between the multivalent vinyl ether compound (A) and the compound (B) each contained in the adhesive, and the adhesive is then solidified to secure the adherend to the support. In the processing step, the secured adherend is subjected to processing. In the debonding step, the solidified adhesive is subjected to a heat treatment at a temperature equal to or higher than the softening point of the polymer to soften or liquefy the adhesive to thereby debond the adherend from the support.

The present invention provides, in still another embodiment, an adhesive film which includes (C) a thermoplastic resin, and a polymer between (A) a multivalent vinyl ether compound and (B) a compound including two or more of a constitutional unit represented by Formula (b):

[Chem. 3]

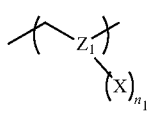

(b)

wherein $Z_1$ represents a group resulting from removing ($n_1$+2) hydrogen atoms from the structural formula of a compound selected from a saturated or unsaturated aliphatic hydrocarbon, a saturated or unsaturated alicyclic hydrocarbon, an aromatic hydrocarbon, a heterocyclic compound, and a compound including two or more of these compounds bonded to each other through a single bond or a linkage group; X is, independently in each occurrence, selected from hydroxy and carboxy; and $n_1$ represents an integer of 1 or more, where $n_1$ occurrences of X may be identical to or different from each other.

Specifically, the present invention relates to the following:
(1) An adhesive containing (A) a multivalent vinyl ether compound, (B) a compound including two or more of a constitutional unit represented by Formula (b) (namely, a compound having a degree of polymerization of the constitutional unit represented by Formula (b) of 2 or more), and (C) a thermoplastic resin.
(2) The adhesive according to (1), wherein the multivalent vinyl ether compound (A) is a compound represented by Formula (a).
(3) The adhesive according to one of (1) and (2), wherein the multivalent vinyl ether compound (A) is at least one compound selected from the group consisting of 1,4-butanediol divinyl ether, diethylene glycol divinyl ether, triethylene glycol divinyl ether, and compounds represented by Formulae (a-1) to (a-21).
(4) The adhesive according to any one of (1) to (3), wherein the compound (B) has a weight-average molecular weight of 1500 or more, as determined by GPC and calibrated with a polystyrene standard.
(5) The adhesive according to any one of (1) to (4), wherein the compound (B) is a compound including two or more of at least one constitutional unit selected from the group consisting of constitutional units represented by Formulae (b-1) to (b-6).
(6) The adhesive according to any one of (1) to (5), wherein the compound (B) is a compound including a constitutional unit represented by Formula (b) in which X is hydroxy, where the constitutional unit is present in an amount of 30 weight percent or more of the totality of the compound (B).
(7) The adhesive according to any one of (1) to (5), wherein the compound (B) is a compound including a constitutional unit represented by Formula (b) in which X is carboxy, where the constitutional unit is present in an amount of 1 weight percent or more of the totality of the compound (B).
(8) The adhesive according to any one of (1) to (7), wherein the compound (B) is a compound including the constitutional unit represented by Formula (b), and a constitutional unit derived from at least one polymerizable monomer selected from the group consisting of chain olefins, cyclic olefins, aromatic vinyl compounds, unsaturated carboxylic acid esters, carboxylic acid vinyl esters, and unsaturated dicarboxylic acid diesters.
(9) The adhesive according to any one of (1) to (8), wherein the compound (B) has a softening point of 50° C. to 250° C.
(10) The adhesive according to any one of (1) to (9), wherein the thermoplastic resin (C) is at least one compound selected from the group consisting of poly(vinyl acetal) resins, polyester resins, polyurethane resins, and polyamide resins.
(11) The adhesive according to any one of (1) to (10), wherein the thermoplastic resin (C) has a weight-average molecular weight of 1500 or more, as determined by GPC and calibrated with a polystyrene standard.
(12) The adhesive according to any one of (1) to (11), wherein a polymer between the multivalent vinyl ether compound (A) and the compound (B) has a softening point higher than the thermal curing temperature of a permanent adhesive to be used in combination, by 10° C. or more.
(13) The adhesive according to any one of (1) to (12), wherein the thermoplastic resin (C) has a softening point higher than the thermal curing temperature of the permanent adhesive to be used in combination, by 10° C. or more.
(14) The adhesive according to any one of (1) to (13), wherein the multivalent vinyl ether compound (A) is present in such an amount that vinyl ether group in the multivalent vinyl ether compound (A) is present in an amount of 0.01 to 10 moles per mole of the totality of hydroxy group and carboxy group in the compound (B),
wherein the thermoplastic resin (C) is present in an amount of 0.1 to 3 parts by weight per 1 part by weight of the compound (B), and
wherein the multivalent vinyl ether compound (A), the compound (B), and the thermoplastic resin (C) are present in combination in a total content of 70 to 99.9 weight percent of the totality of non-volatile components in the adhesive.
(15) The adhesive according to any one of (1) to (14), further containing at least one of a monovalent carboxylic acid represented by Formula (d) and a monohydric alcohol represented by Formula (e).
(16) The adhesive according to any one of (1) to (15), which has a total proportion of a monovalent carboxylic acid represented by Formula (d) and a monohydric alcohol represented by Formula (e) of 0.01 to 5 parts by weight per 1 part by weight of the multivalent vinyl ether compound (A).
(17) The adhesive according to any one of (1) to (16), further containing an antioxidant in an amount of 0.01 to 15 parts by weight per 100 parts by weight of the totality of the compound (B) and the thermoplastic resin (C).
(18) The adhesive according to any one of (1) to (17), which has a viscosity of 30 to 2000 mPa·s as determined at 25° C. and a shear rate of 50 s$^{-1}$.
(19) A method for temporarily securing an adherend to a support using an adhesive, the method including a securing step of subjecting the adhesive according to any one of (1) to (18) to a heat treatment to form a polymer between the multivalent vinyl ether compound (A) and the compound (B) each contained in the adhesive, and subsequently solidifying the adhesive to secure the adherend to the support; and a debonding step of subjecting the solidified adhesive to a heat treatment at a temperature equal to or higher than the softening point of the polymer to soften or liquefy the adhesive to thereby debond the adherend from the support.

(20) A method for processing an adherend while being temporarily secured to a support using an adhesive, the method including a securing step of subjecting the adhesive according to any one of (1) to (18) to a heat treatment to form a polymer between the multivalent vinyl ether compound (A) and the compound (B) each contained in the adhesive, and subsequently solidifying the adhesive to secure the adherend to the support; a processing step of processing the secured adherend; and a debonding step of subjecting the solidified adhesive to a heat treatment at a temperature equal to or higher than the softening point of the polymer to soften or liquefy the adhesive to debond the adherend from the support.

(21) An adhesive film including a polymer between (A) a multivalent vinyl ether compound and (B) a compound including two or more of a constitutional unit represented by Formula (b); and a thermoplastic resin (C).

Advantageous Effects of Invention

The adhesive according to the present invention has the configuration, thereby gives a solidified product which has excellent flexibility, which do not suffer from spontaneous debonding and cracking even in a high-temperature environment and in an environment with abrupt temperature change, which can bond/secure the adherend with maintaining high adhesiveness while securing of the adherend to the support is required, and which allows the adherend to be easily debonded (typically by slide debonding) without causing breakage of the adherend, by subjecting the article typically to a heat treatment when the securing of the adherend becomes unnecessary. In addition, the adhesive, when remaining on the adherend after debonding (i.e., adhesive residue), can be easily dissolved and removed by washing with a solvent. The adhesive according to the present invention is therefore advantageously usable as an adhesive for temporarily securing a fragile adherend (namely, temporary adhesive). In particular, the adhesive is preferably used as an adhesive for temporary securing (temporary adhesive) in a production process of thinned semiconductor chips.

DESCRIPTION OF EMBODIMENTS

Multivalent Vinyl Ether Compound (A)

The multivalent vinyl ether compound (A) is hereinafter also referred to as a "compound (A)". The compound (A) is a compound containing two or more vinyl ether groups in one molecule and is represented typically by Formula (a):

[Chem. 4]

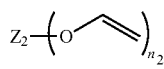
(a)

In Formula (a), $Z_2$ represents a group resulting from removing $n_2$ hydrogen atoms from the structural formula of a compound selected from a saturated or unsaturated aliphatic hydrocarbon, a saturated or unsaturated alicyclic hydrocarbon, an aromatic hydrocarbon, a heterocyclic compound, and a compound including two or more of these compounds bonded to each other through a single bond or a linkage group.

In Formula (a), $n_2$ represents an integer of 2 or more and is typically an integer of 2 to 5, and preferably an integer of 2 or 3.

Of such groups resulting from removing $n_2$ hydrogen atoms each from the structural formulae of saturated or unsaturated aliphatic hydrocarbons, non-limiting examples of groups resulting from removing two hydrogen atoms each from the structural formulae of saturated or unsaturated aliphatic hydrocarbons include linear or branched alkylenes such as methylene, ethylene, propylene, trimethylene, tetramethylene, pentamethylene, hexamethylene, octamethylene, decamethylene, and dodecamethylene, of which $C_1$-$C_{20}$ alkylenes are typified, and $C_1$-$C_{10}$ alkylenes are preferred; and linear or branched alkenylenes such as vinylene, 1-propenylene, and 3-methyl-2-butenylene, of which $C_2$-$C_{20}$ alkenylenes are typified, and $C_2$-$C_{10}$ alkenylenes are preferred. Non-limiting examples of groups resulting from removing three or more hydrogen atoms each from the structural formulae of saturated or unsaturated aliphatic hydrocarbons include groups resulting from further removing one or more hydrogen atoms each from the structural formulae of the above-exemplified groups.

Of groups resulting from removing $n_2$ hydrogen atoms each from the structural formulae of saturated or unsaturated alicyclic hydrocarbons, non-limiting examples of groups resulting from removing two hydrogen atoms each from the structural formulae of saturated or unsaturated alicyclic hydrocarbons include cycloalkylenes such as 1,2-cyclopentylene, 1,3-cyclopentylene, 1,2-cyclohexylene, 1,3-cyclohexylene, and 1,4-cyclohexylene, of which 3- to 15-membered cycloalkylenes are typified; cycloalkenylenes such as cyclopentenylene and cyclohexenylene, of which 3- to 15-membered cycloalkenylenes are typified; cycloalkylidenes such as cyclopentylidene and cyclohexylidene, of which 3- to 15-membered cycloalkylidenes are typified; and divalent bridged hydrocarbon groups such as adamantanediyls, norbornanediyls, norbornenediyls, isobornanediyls, tricyclodecanediyls, tricycloundecanediyls, and tetracyclododecanediyls, of which 4- to 15-membered divalent bridged groups are typified. Non-limiting examples of groups resulting from removing three or more hydrogen atoms each from the structural formulae of saturated or unsaturated alicyclic hydrocarbons include groups resulting from further removing one or more hydrogen atoms each from the structural formulae of the above-exemplified groups.

Non-limiting examples of the aromatic hydrocarbon include benzene, naphthalene, and anthracene.

The category heterocyclic compound includes aromatic heterocyclic compounds and non-aromatic heterocyclic compounds. Non-limiting examples of such heterocyclic compounds include oxygen-containing heterocyclic compounds, sulfur-containing heterocyclic compounds, and nitrogen-containing heterocyclic compounds, where oxygen, sulfur, and nitrogen are contained as heteroatoms. Non-limiting examples of the oxygen-containing heterocyclic compounds include 5-membered rings such as furan, tetrahydrofuran, oxazole, isoxazole, and γ-butyrolactone rings; 6-membered rings such as 4-oxo-4H-pyran, tetrahydropyran, and morpholine rings; fused rings such as benzofuran, isobenzofuran, 4-oxo-4H-chromene, chroman, and isochroman rings; and bridged rings such as 3-oxatricyclo

[4.3.1.1⁴,⁸]undecan-2-one and 3-oxatricyclo[4.2.1.0⁴,⁸]nonan-2-one rings. Non-limiting examples of the sulfur-containing heterocyclic compounds include 5-membered rings such as thiophene, thiazole, isothiazole, and thiadiazole rings; 6-membered rings such as 4-oxo-4H-thiopyran ring; and fused rings such as benzothiophene ring. Non-limiting examples of the nitrogen-containing heterocyclic compounds include 5-membered rings such as pyrrole, pyrrolidine, pyrazole, imidazole, and triazole rings; 6-membered rings such as pyridine, pyridazine, pyrimidine, pyrazine, piperidine, and piperazine rings; and fused rings such as indole, indoline, quinoline, acridine, naphthyridine, quinazoline, and purine rings.

Non-limiting examples of the linkage group include divalent, trivalent, or tetravalent hydrocarbon groups, carbonyl (—CO—), ether bond (—O—), sulfide bond (—S—), ester bond (—COO—), amido bond (—CONH—), carbonate bond (—OCOO—), urethane bond (—NHCOO—), —NR— bond, where R is selected from hydrogen, alkyl, and acyl, and groups each including two or more of these groups linked to each other. Of the divalent, trivalent, or tetravalent hydrocarbon groups, non-limiting examples of the divalent hydrocarbon groups include linear or branched $C_1$-$C_{10}$ alkylenes such as methylene, methylmethylene, dimethylmethylene, ethylene, propylene, and trimethylene; and $C_4$-$C_{15}$ alicyclic hydrocarbon groups such as 1,2-cyclopentylene, 1,3-cyclopentylene, cyclopentylidene, 1,2-cyclohexylene, 1,3-cyclohexylene, 1,4-cyclohexylene, and cyclohexylidene, of which cycloalkylenes are typified. Non-limiting examples of the trivalent hydrocarbon groups include groups resulting from further removing one hydrogen atom each from the structural formulae of the divalent hydrocarbon groups. Non-limiting examples of the tetravalent hydrocarbon groups include groups resulting from further removing two hydrogen atoms each from the structural formulae of the divalent hydrocarbon groups.

$Z_2$ may have one or more substituents. Non-limiting examples of the substituents include alkyls such as methyl, ethyl, and other $C_1$-$C_4$ alkyls; cycloalkyls such as $C_3$-$C_{10}$ cycloalkyls; alkenyls such as vinyl and other $C_2$-$C_{10}$ alkenyls; cycloalkenyls such as $C_3$-$C_{10}$ cycloalkenyls; aryls such as phenyl, naphthyl, and other $C_6$-$C_{15}$ aryls; hydroxy; carboxy; nitro; amino; mercapto; halogens; halogen-substituted $C_2$-$C_{10}$ hydrocarbon groups; $C_1$-$C_4$ alkoxys, $C_2$-$C_6$ acyloxys, and other hydrocarbon groups having a heteroatom-containing functional group, where the heteroatom is exemplified typically by oxygen and sulfur; and groups including two or more of these groups bonded to each other.

Specific, but non-limiting examples of the compound (A) include 1,4-butanediol divinyl ether, diethylene glycol divinyl ether, triethylene glycol divinyl ether, and compounds represented by the formulae:

[Chem. 5]

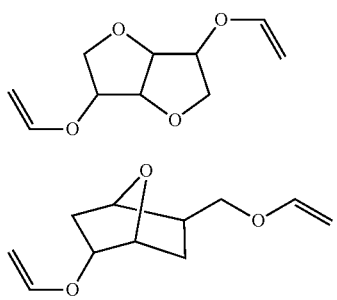
(a-1)

(a-2)

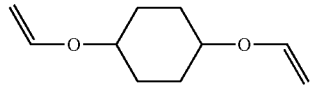
(a-3)

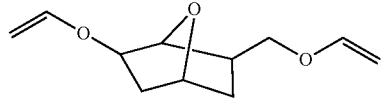
(a-4)

(a-5)

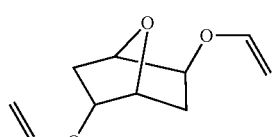
(a-6)

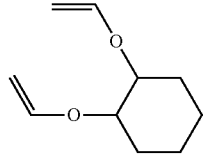
(a-7)

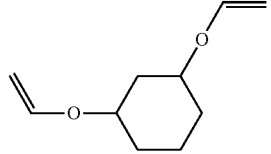
(a-8)

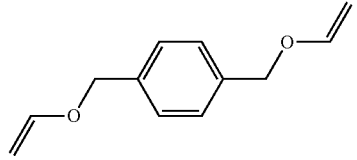
(a-9)

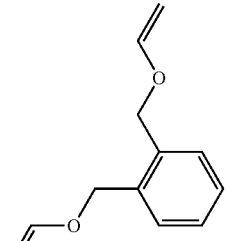
(a-10)

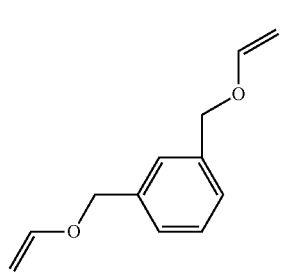
(a-11)

-continued (a-12) 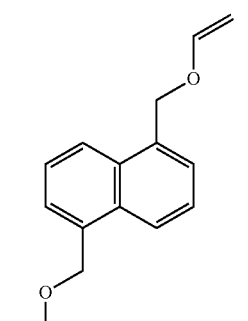

(a-13) 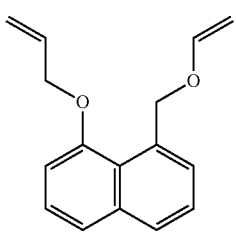

(a-14) 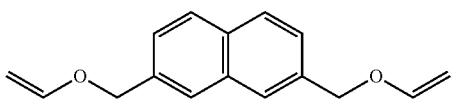

(a-15) 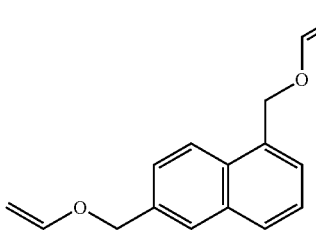

(a-16) 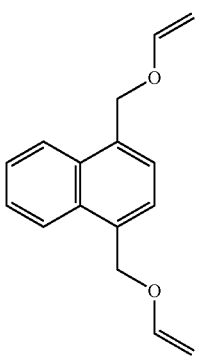

(a-17) 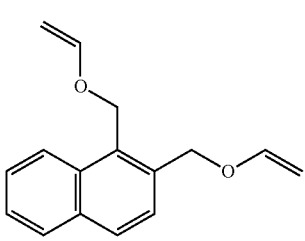

-continued (a-18) 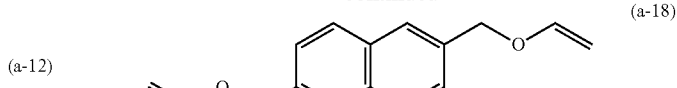

(a-19) 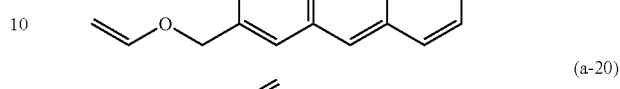

(a-20) 

(a-21) 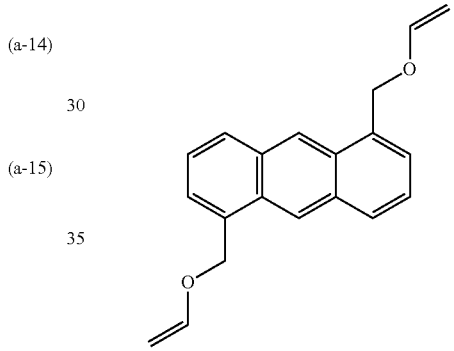

For the formation of a polymer having a high softening point, $Z_2$ herein is, in particular, preferably a group resulting from removing $n_2$ hydrogen atoms from the structural formula of a compound selected from a saturated or unsaturated aliphatic hydrocarbon, and a compound including two or more of these compounds bonded to each other through a linkage group; is particularly preferably a group resulting from removing $n_2$ hydrogen atoms from the structural formula of a saturated aliphatic hydrocarbon or of a compound including saturated aliphatic hydrocarbons bonded to each other through a linkage group; and is especially preferably a group selected from a $C_1$-$C_{20}$ linear alkylene group, a $C_2$-$C_{20}$ branched alkylene group, and a group resulting from removing $n_2$ hydrogen atoms from the structural formula of a compound including two or more of these groups bonded to each other through a linkage group.

The compound (A) for use in the present invention is most preferably at least one compound selected from the group consisting of 1,4-butanediol divinyl ether, diethylene glycol divinyl ether, and triethylene glycol divinyl ether.

Compound (B)

The compound (B) is a compound including two or more of a constitutional unit (constitutional repeating unit) represented by Formula (b):

[Chem. 7]

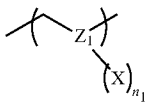
(b)

In Formula (b), X is selected from hydroxy and carboxy, where $n_1$ occurrences of X may be identical to or different from each other.

In Formula (b), $n_1$ represents an integer of 1 or more. The number $n_1$ is preferably an integer of 1 to 3, and particularly preferably an integer of 1 or 2, because a compound (B) of this configuration is readily available, has excellent solubility in a solvent, and can form a polymer having a high softening point.

The number of the constitutional unit (constitutional repeating unit) represented by Formula (b) in the compound (B) is 2 or more. For the formation of a polymer having a high softening point, the number is preferably an integer of 2 to 40, and particularly preferably an integer of 10 to 30.

In Formula (b), $Z_1$ represents a group resulting from removing ($n_1+2$) hydrogen atoms from the structural formula of a compound selected from a saturated or unsaturated aliphatic hydrocarbon, a saturated or unsaturated alicyclic hydrocarbon, an aromatic hydrocarbon, a heterocyclic compound, and a compound including two or more of these compounds bonded to each other through a single bond or a linkage group. Non-limiting examples of the structural formulae of the saturated or unsaturated aliphatic hydrocarbon, saturated or unsaturated alicyclic hydrocarbon, aromatic hydrocarbon, heterocyclic compound, and compound including two or more of these compounds bonded to each other through a single bond or a linkage group are as with the examples in $Z_2$.

The compound (B) is preferably selected typically from styrenic polymers, (meth)acrylic polymers, poly(vinyl alcohol)s, novolac resins, and resol resins and, particularly preferably selected from compounds each including two or more of at least one constitutional unit (constitutional repeating unit) selected from constitutional units represented by Formulae (b-1) to (b-6):

[Chem. 8]

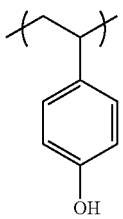
(b-1)

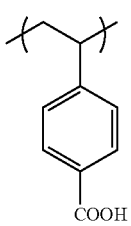
(b-2)

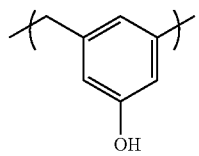
(b-3)

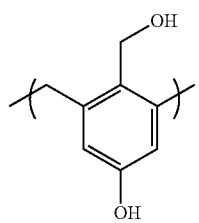
(b-4)

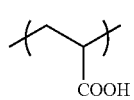
(b-5)

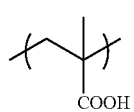
(b-6)

Assume that a compound including a constitutional unit represented by Formula (b) in which X is hydroxy is used as the compound (B). In this case, the proportion of the constitutional unit represented by Formula (b) is preferably 30 weight percent or more, particularly preferably 50 weight percent or more, and most preferably 60 weight percent or more, of the totality of the compound (B); and the proportion of the constitutional unit represented by Formula (b) is preferably 30 mole percent or more, and particularly preferably 50 mole percent or more, of the totality of the compound (B).

Assume that a compound including a constitutional unit represented by Formula (b) in which X is carboxy is used as the compound (B). In this case, the proportion of the constitutional unit represented by Formula (b) is preferably 1 weight percent or more, particularly preferably 5 weight percent or more, and most preferably 10 weight percent or more, of the totality of the compound (B).

The compound (B), if including the constitutional unit represented by Formula (b) in a proportion less than the range, tends to give, as a result of polymerization with the compound (A), a polymer having a lower weight-average molecular weight and a lower softening point, because of longer distances between crosslinking points and smaller amounts of crosslinking points. This tends to cause the resulting solidified adhesive to less satisfactorily maintain adhesiveness in a high-temperature environment.

Specifically, the compound (B) for use in the present invention may be a homopolymer including the constitutional unit or units represented by Formula (b) alone, or a copolymer including the constitutional unit or units represented by Formula (b) in combination with another constitutional unit or units. The compound (B), when being a copolymer, may be any one of a block copolymer, a graft copolymer, and a random copolymer.

The other constitutional unit is a constitutional unit derived from a polymerizable monomer devoid of hydroxy and carboxy; and non-limiting examples thereof include olefins, aromatic vinyl compounds, unsaturated carboxylic acid esters, carboxylic acid vinyl esters, and unsaturated dicarboxylic acid diesters. Non-limiting examples of the olefins include chain olefins such as ethylene, propylene, and 1-butene, of which $C_2$-$C_{12}$ alkenes are typified; cyclic olefins such as cyclopentene, cyclohexene, cycloheptene, norbornene, 5-methyl-2-norbornene, and tetracyclododecene, of which $C_3$-$C_{10}$ cycloalkenes are typified. Non-limiting examples of the aromatic vinyl compounds include $C_7$-$C_{14}$ aromatic vinyl compounds such as styrene, vinyltoluene, α-methylstyrene, 1-propenylbenzene, 1-vinylnaphthalene, 2-vinylnaphthalene, 3-vinylpyridine, 3-vinylfuran, 3-vinylthiophene, 3-vinylquinoline, indene, methylindene, ethylindene, and dimethylindene. Non-limiting examples of the unsaturated carboxylic acid esters include ethyl (meth)acrylate, butyl (meth)acrylate, isobutyl (meth)acrylate, 2-ethylhexyl (meth)acrylate, dicyclopentanyl (meth)acrylate, and other esters resulting from reaction of an unsaturated carboxylic acid (such as (meth)acrylic acid) with an alcohol R"—OH, where R" represents a group resulting from removing one hydrogen atom from the structural formula of a compound selected from a saturated or unsaturated aliphatic hydrocarbon, a saturated or unsaturated alicyclic hydrocarbon, an aromatic hydrocarbon, a heterocyclic compound, and a compound including two or more of these compounds bonded to each other through a single bond or a linkage group, and non-limiting examples of R" include monovalent groups corresponding to the examples as $Z_2$ in Formula (a). Non-limiting examples of the carboxylic acid vinyl esters include $C_1$-$C_{16}$ fatty acid vinyl esters such as vinyl acetate, vinyl propionate, vinyl caprylate, and vinyl caproate. Non-limiting examples of the unsaturated dicarboxylic acid diesters include maleic acid di-$C_1$-$C_{10}$ alkyl esters such as diethyl maleate, dibutyl maleate, dioctyl maleate, and 2-ethylhexyl maleate; and fumaric acid diesters corresponding to these esters. Each of them may be used alone or in combination.

In particular, the compound (B), when being a copolymer, is preferably a compound including the constitutional unit represented by Formula (b) and, in combination, a constitutional unit or units derived from at least one polymerizable monomer selected from chain olefins, cyclic olefins, aromatic vinyl compounds, unsaturated carboxylic acid esters, carboxylic acid vinyl esters, and unsaturated dicarboxylic acid diesters.

The compound (B) preferably has a softening point ($T^1$) of typically about 50° C. to about 250° C., preferably 80° C. to 200° C., and particularly preferably 100° C. to 150° C., for excellent coatability of the adhesive. The compound (B), if having a softening point $T^1$ higher than the range, tends to cause the adhesive to be hardly coatable, because of lower fluidity. On the other hand, assume that the compound (B) has a softening point $T^1$ lower than the range. Even when the compound (B) in this case is polymerized with the compound (A), the resulting polymer can hardly have a softening point higher than the thermal curing temperature of the permanent adhesive. The adhesive according to the present invention in this case tends to hardly hold or secure the adherend because the adhesive softens before the permanent adhesive is cured.

The softening point $T^1$ can be controlled by the weight-average molecular weight (as determined by GPC and calibrated with a polystyrene standard) of the compound (B). The weight-average molecular weight of the compound (B) is typically 1500 or more, preferably 1800 to 10000, and particularly preferably 2000 to 5000.

Thermoplastic Resin (C)

The thermoplastic resin (C) is not limited, as long as being a compound that has thermoplasticity and, when contained in the adhesive, can impart flexibility to the solidified product of the adhesive. Non-limiting examples of the thermoplastic resin (C) include polycondensation resins such as poly(vinyl acetal) resins, polyester resins, polyurethane resins, polyamide resins, poly(thio)ether resins, polycarbonate resins, polysulfone resins, and polyimide resins; resins resulting from vinyl polymerization, such as polyolefin resins, (meth)acrylic resins, styrenic resins, and vinyl resins; and cellulose derivatives and other resins derived from natural products. The adhesive may contain each of different types of them alone or in combination. The adhesive according to the present invention, as containing the thermoplastic resin (C), can give a solidified product which has flexibility (or elasticity), which resists spontaneous debonding and cracking even in an environment with abrupt temperature change, and which can maintain excellent adhesiveness.

The adhesive preferably contains, as the thermoplastic resin (C), at least one compound selected from poly(vinyl acetal) resins, polyester resins, polyurethane resins, and polyamide resins, and, in particular, preferably contains at least a polyester. This configuration is preferred because the resulting adhesive can have flexibility, has little chemical interaction with the adherend such as a wafer, and, when remaining on the adherend after debonding, can be more easily removed. Most preferably, the adhesive contains a poly(vinyl acetal) resin and a polyester in combination as the thermoplastic resin (C). This configuration is preferred because the resulting adhesive can have flexibility, offers particularly excellent adhesion to the adherend, and, when remaining on the adherend after debonding, can be still more easily removed.

Non-limiting examples of the poly(vinyl acetal) resins include resins including a constitutional unit represented by the following formula, which resins result from the reaction of a poly(vinyl alcohol) with an aldehyde, where the aldehyde is exemplified typically by formaldehyde, butyraldehyde, benzaldehyde, and other compounds represented by: RCHO where R is selected from hydrogen, linear $C_1$-$C_5$ alkyl, branched $C_2$-$C_5$ alkyl, and $C_6$-$C_{10}$ aryl. In the following formula, R is as defined above. The poly(vinyl acetal) resins for use in the present invention may each include one or more other constitutional units in addition to the constitutional unit represented by the following formula. Specifically, the category poly(vinyl acetal) resins for use in the present invention includes homopolymers and copolymers. Specifically, non-limiting examples of the poly(vinyl acetal) resins for use in the present invention include poly(vinyl formal)s and poly(vinyl butyral)s, which may be selected typically from commercial products such as S-LEC KS-1 and S-LEC KS-10 (trade names, each from Sekisui Chemical Co., Ltd.). The formula is expressed as follows:

[Chem. 9]

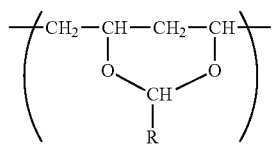

Non-limiting examples of the polyester resins include polyesters each resulting from polycondensation of a diol component and a dicarboxylic acid component, where the diol component is exemplified typically by aliphatic $C_2$-$C_{12}$ diols such as ethylene glycol, as well as polyoxy-$C_2$-$C_4$ alkylene glycols such as diethylene glycol; alicyclic $C_5$-$C_{15}$ diols such as cyclohexanedimethanol; and aromatic $C_6$-$C_{20}$ diols such as bisphenol-A, and the dicarboxylic acid component is exemplified typically by aromatic $C_8$-$C_{20}$ dicarboxylic acids such as terephthalic acid; aliphatic $C_2$-$C_{40}$ dicarboxylic acids such as adipic acid; and alicyclic $C_8$-$C_{15}$ dicarboxylic acids such as cyclohexanedicarboxylic acids. Non-limiting examples of the polyester resins also include polyesters resulting from polycondensation of a hydroxycarboxylic acid, where the hydroxycarboxylic acid is exemplified typically by aliphatic $C_2$-$C_6$ hydroxycarboxylic acids such as lactic acid, and aromatic $C_7$-$C_{19}$ hydroxycarboxylic acids such as hydroxybenzoic acids; polyesters resulting from ring-opening polymerization of a lactone, where the lactone is exemplified typically by $C_4$-$C_{12}$ lactones such as ε-caprolactone, δ-valerolactone, and γ-butyrolactone; and urethane-bond-containing polyesters resulting from reaction of a polyester diol with a diisocyanate. The category polyester resins includes homopolyesters and copolyesters. The polyester resins for use in the present invention may be selected from commercial products available typically under the trade name of PLACCEL H1P (from Daicel Corporation).

Non-limiting examples of the polyurethane resins include resins resulting from reaction of a diisocyanate with a polyol, and, as needed, a chain extender. Non-limiting examples of the diisocyanate include aliphatic diisocyanates such as hexamethylene diisocyanate; alicyclic diisocyanates such as isophorone diisocyanate; and aromatic diisocyanates such as tolylene diisocyanate. Non-limiting examples of the polyol include polyester diols, polyether diols, and polycarbonate diols. Non-limiting examples of the chain extender include $C_2$-$C_{10}$ alkylenediols such as ethylene glycol; aliphatic diamines such as ethylenediamine; alicyclic diamines such as isophoronediamine; and aromatic diamines such as phenylenediamine.

Non-limiting examples of the polyamide resins include polyamides resulting from polycondensation of a diamine component with a dicarboxylic acid component, where the diamine component is exemplified typically by $C_4$-$C_{10}$ alkylenediamines such as hexamethylenediamine, and the dicarboxylic acid component is exemplified typically by $C_4$-$C_{20}$ alkylenedicarboxylic acids such as adipic acid; polyamides resulting from polycondensation of an aminocarboxylic acid, where the aminocarboxylic acid is exemplified typically by $C_4$-$C_{20}$ aminocarboxylic acids such as ω-aminoundecanoic acid; polyamides resulting from ring-opening polymerization of a lactam, where the lactam is exemplified typically by $C_4$-$C_{20}$ lactams such as ω-laurolactam; and polyesteramides resulting from polycondensation of a diamine component with a dicarboxylic acid component and a diol component, where the diamine component is exemplified typically by $C_4$-$C_{10}$ alkylenediamines such as hexamethylenediamine, the dicarboxylic acid component is exemplified typically by $C_4$-$C_{20}$ alkylenedicarboxylic acids such as adipic acid, and the diol component is exemplified typically by $C_2$-$C_{12}$ alkylenediols such as ethylene glycol. The category polyamide resins includes homopolyamides and copolyamides.

When the adhesive according to the present invention is used as a temporary adhesive, the softening point ($T^2$) of the thermoplastic resin (C) is preferably higher than the thermal curing temperature of a permanent adhesive to be used in combination with the temporary adhesive, by 10° C. or more (typically 10° C. to 40° C., and particularly preferably 20° C. to 30° C.)

The softening point $T^2$ can be adjusted by controlling the weight-average molecular weight (Mw) of the thermoplastic resin (C), where the weight-average molecular weight is determined by GPC and calibrated with a polystyrene standard. The thermoplastic resin (C) is preferably selected from resins having a weight-average molecular weight of typically 1500 to 100000, preferably 2000 to 80000, particularly preferably 3000 to 50000, especially preferably 10000 to 45000, and most preferably 15000 to 35000.

Adhesive

The adhesive according to the present invention contains the compound (A), the compound (B), and the thermoplastic resin (C).

When the adhesive according to the present invention is used as a temporary adhesive, the softening point ($T^1$) of the polymer between the compound (A) and the compound (B) is preferably higher than the thermal curing temperature of the permanent adhesive to be used in combination with the temporary adhesive, by 10° C. or more (typically 10° C. to 40° C., and particularly preferably 20° C. to 30° C.)

Assume that the permanent adhesive has, for example, a thermal curing temperature of 120° C. In this case, the amount of the compound (A) in the adhesive according to the present invention may be such an amount that the amount of vinyl ether group in the multivalent vinyl ether compound (A) is 0.01 to 10 moles, preferably 0.05 to 5 moles, particularly preferably 0.07 to 1 mole, and most preferably 0.08 to 0.50, per mole of the totality of hydroxy group and carboxy group in the compound (B) contained in the adhesive.

The amount of the thermoplastic resin (C) in the adhesive according to the present invention may be 0.1 to 3 parts by weight, preferably 0.2 to 2 parts by weight, and particularly preferably 0.3 to 1 part by weight, per 1 part by weight of the compound (B) contained in the adhesive.

The total amount of the compound (A), the compound (B), and the thermoplastic resin (C) in the adhesive according to the present invention may be 70 to 99.9 weight percent, preferably 80 to 99 weight percent, particularly preferably 85 to 95 weight percent, and most preferably 85 to 90 weight percent, of the totality of non-volatile components in the adhesive.

Other Component (1)

The adhesive according to the present invention may further contain a polymerization promoter. Non-limiting examples of the polymerization promoter include monovalent carboxylic acids represented by Formula (d), and monohydric alcohols represented by Formula (e). The adhesive may contain each of different types of them alone or in combination. The polymerization promoter, when contained in the adhesive, can promote the polymerization reaction of the compound (A) and the compound (B). The adhesive according to this embodiment can form a polymer having an equivalent, or a still higher, softening point even when polymerization is performed with heating at a lower temperature, and can maintain its adhesiveness even in an environment at a higher temperature (for example, about 160° C. to about 180° C.), as compared with an adhesive devoid of polymerization promoters. Formulae (d) and (e) are expressed as follows:

$$Z_3\text{—COOH} \qquad (d)$$

wherein $Z_3$ represents a group resulting from removing one hydrogen atom from the structural formula of a compound selected from the group consisting of saturated or unsaturated aliphatic hydrocarbons, saturated or unsaturated alicyclic hydrocarbons, and aromatic hydrocarbons, each of which may have one or more substituents excluding carboxy, $$Z_4\text{—OH} \tag{e}$$

wherein $Z_4$ represents a group resulting from removing one hydrogen atom from the structural formula of an aromatic hydrocarbon which may have one or more substituents excluding hydroxy.

Non-limiting examples of the saturated or unsaturated aliphatic hydrocarbons, saturated or unsaturated alicyclic hydrocarbons, and aromatic hydrocarbons as $Z_3$ in Formula (d), and of the aromatic hydrocarbon as $Z_4$ in Formula (e) include monovalent groups corresponding to the examples as $Z_2$. Non-limiting examples of the substituents which $Z_3$ may have are as with the examples of the substituents which $Z_2$ may have, excluding carboxy. Non-limiting examples of the substituents which $Z_4$ may have are as with the examples of the substituents which $Z_2$ may have, excluding hydroxy.

The polymerization promoter for use in the present invention has a pKa (acid dissociation constant) of preferably 3 to 8, and particularly preferably 4 to 6. The polymerization promoter, if having a pKa less than the range, tends to cause the adhesive to have lower storage stability, typically because polymerization proceeds in the adhesive and causes the adhesive to have a higher viscosity. On the other hand, the polymerization promoter, if having a pKa greater than the range, tends to less effectively promote polymerization.

Of the monovalent carboxylic acids represented by Formula (d), preferred are compounds (including geometric isomers) represented by the formulae:

[Chem. 10]

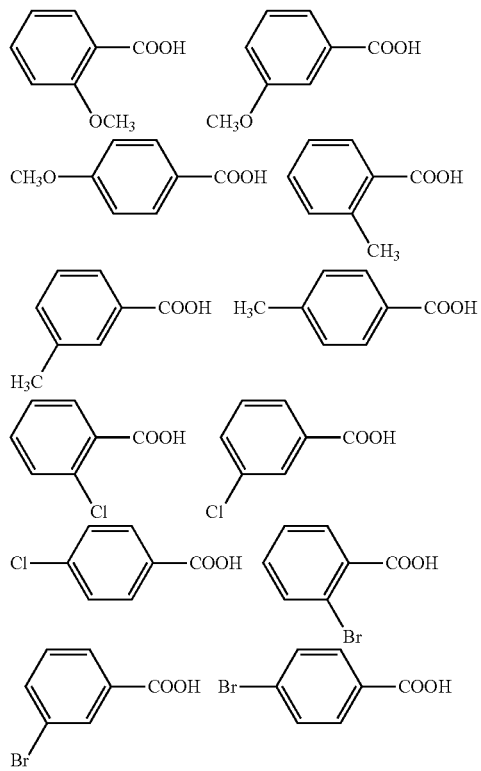

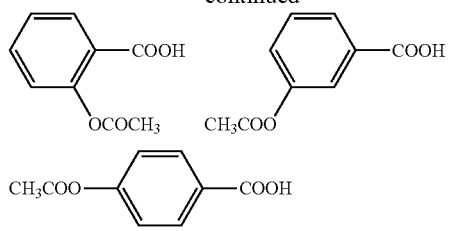

[Chem. 11]

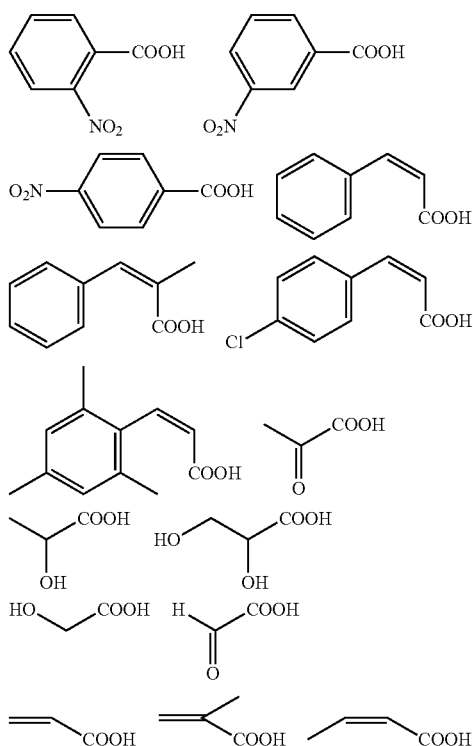

Of the monohydric alcohols represented by Formula (e), preferred are compounds represented by the formulae:

[Chem. 12]

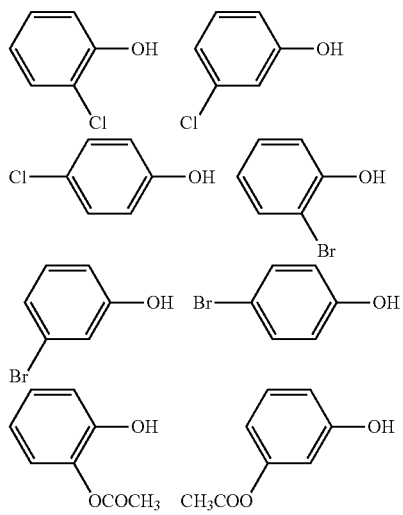

-continued

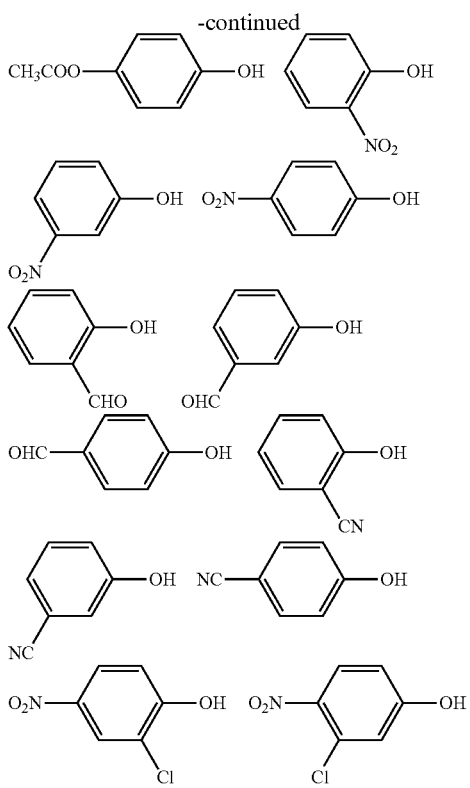

The adhesive may contain the polymerization promoter in an amount of typically about 0.01 to about 5 parts by weight (preferably 0.1 to 3 parts by weight, and particularly preferably 0.3 to 1 part by weight), per 1 part by weight of the compound (A) contained in the adhesive.

Other Component (2)

The adhesive according to the present invention may further contain an antioxidant. The antioxidant, when contained in the adhesive according to the present invention, can eliminate or minimize oxidation, upon heat treatment, of the compound (B) and the thermoplastic resin (C) in the adhesive. Advantageously, this allows a composition to have still better solubility in a solvent, where the composition results from subjecting the solidified product of the adhesive to a heat treatment to soften or liquefy the solidified product; and allows adhesive residue, when remaining on the adherend after debonding, to be extremely easily removed using the solvent.

Non-limiting examples of the antioxidant include phenolic antioxidants, phosphorus antioxidants, thio ester antioxidants, and amine antioxidants. The adhesive may contain each of different types of them alone or in combination. Among them, the antioxidant for use in the present invention is preferably selected from phenolic antioxidants for particularly satisfactorily eliminating or minimizing the oxidation upon heat treatment.

Non-limiting examples of the phenolic antioxidants include pentaerythritol tetrakis[3-(3,5-di-t-butyl-4-hydroxyphenyl)propionate], thiodiethylene bis[3-(3,5-di-t-butyl-4-hydroxyphenyl)propionate], octadecyl 3-(3,5-di-t-butyl-4-hydroxyphenyl)propionate, N,N'-hexamethylenebis[3-(3,5-di-t-butyl-4-hydroxyphenyl)propionamide], octyl 3-(4-hydroxy-3,5-diisopropylphenyl)propionate, 1,3,5-tris(4-hydroxy-3,5-di-t-butylbenzyl)-2,4,6-trimethylbenzene, 2,4-bis(dodecylthiomethyl)-6-methylphenol, and calcium bis[3,5-di(t-butyl)-4-hydroxybenzyl(ethoxy)phosphinate]. Such phenolic antioxidants for use in the present invention may be selected from commercial products such as Irganox 1010, Irganox 1035, Irganox 1076, Irganox 1098, Irganox 1135, Irganox 1330, Irganox 1726, and Irganox 1425 WL (trade names, each from BASF SE).

The adhesive may contain the antioxidant in an amount (or in a content) of typically 0.01 to 15 parts by weight (preferably 0.1 to 12 parts by weight, and particularly preferably 0.5 to 10 parts by weight), per 100 parts by weight of the totality of the compound (B) and the thermoplastic resin (C) each contained in the adhesive. When the adhesive contains one or more different antioxidants, the term "amount" (or "content") is read as "total amount" (or "total content") of them.

Other Component (3)

The adhesive according to the present invention may further contain one or more other components as needed. Non-limiting examples of the other components include acid generators, surfactants, solvents, leveling agents, silane coupling agents, and blowing agents. The adhesive may contain each of different types of them alone or in combination.

Acid Generator

The acid generators are compounds including a cationic moiety that absorbs heat or light, and an anionic moiety that acts as an acid source. The category acid generators includes thermal acid generators and photoacid generators. The adhesive may contain each of different types of them alone or in combination.

Assume that the adhesive according to the present invention contains such an acid generator. In this case, the acid generated from the acid generator reacts with the polymer between the compound (A) and the compound (B) each contained in the solidified product of the adhesive to decompose the polymer at acetal bonding sites into low-molecular-weight products (fragments). This solidified product of the adhesive can be softened or liquefied to have lower adhesiveness or to lose adhesiveness at a lower temperature as compared with an adhesive devoid of acid generators. In addition, this configuration enables still easier washing (cleaning) of the adhesive residue.

The thermal acid generators are compounds that generate, for example, a sulfonic acid (such as perfluoroalkylsulfonic acid) or a sulfonium cation by a heat treatment (in particular, a heat treatment at a temperature higher than the solidification temperature). Non-limiting examples of the thermal acid generators include aryldiazonium salts, aryliodonium salts, arylsulfonium salts, and allene-ion complexes. Such thermal acid generators for use in the present invention may be selected from commercial products such as SI-180L (trade name, from SANSHIN CHEMICAL INDUSTRY CO., LTD.).

The adhesive may contain the thermal acid generator in an amount (proportion) of typically about 0.01 to about 0.1 part by weight, preferably 0.03 to 0.5 part by weight, and particularly preferably 0.05 to 0.1 part by weight, per 1 part by weight of the compound (A).

The photoacid generators are compounds that generate, for example, an acid or a cation by the application of light. The acid is exemplified typically by perfluoroalkylsulfonic acids and perfluorophosphonium-sulfonic acid. The cation is exemplified typically by sulfonium cation. Non-limiting examples of the photoacid generators include iodonium salt compounds, of which aryliodonium salt compounds are preferred, and bisaryliodonium salt compounds are particularly preferred; and sulfonium salt compounds, of which arylsulfonium salt compounds are preferred, and triarylsulfonium salt compounds are particularly preferred. The adhesive may contain each of different types of them alone or in combination.

Non-limiting examples of the cationic moieties of the photoacid generators include iodonium ions and sulfonium ions.

Non-limiting examples of the iodonium ions include aryliodonium ions such as diphenyliodonium ion, di-p-tolyliodonium ion, bis(4-dodecylphenyl)iodonium ion, bis(4-methoxyphenyl)iodonium ion, (4-octyloxyphenyl)phenyliodonium ion, bis(4-decyloxy)phenyliodonium ion, 4-(2-hydroxytetradecyloxyphenyl)phenyliodonium ion, 4-isopropylphenyl (p-tolyl)iodonium ion, and 4-isobutylphenyl (p-tolyl)iodonium ion, of which bisaryliodonium ions are typified.

Non-limiting examples of the sulfonium ions include arylsulfonium ions such as triphenylsulfonium ion, diphenyl[4-(phenylthio)phenyl]sulfonium ion, and tri-p-tolylsulfonium ion, of which triarylsulfonium ions are typified.

Non-limiting examples of the anionic moieties of the photoacid generators include perfluoroalkanesulfonium ions, perfluorophosphonium sulfonium ions, perfluoroantimonium sulfonium ions, $BF_4^-$, $B(C_6F_5)_4^-$, $PF_6^-$, $[(Rf)_n PF_{6-n}]^-$ (where Rf represents a group resulting from replacing 80% or more of hydrogen atoms of an alkyl group with fluorine atoms; and n represents an integer of 1 to 5), $AsF_6^-$, $SbF_6^-$, and pentafluorohydroxyantimonate. Among them, perfluoroalkanesulfonium ions and perfluorophosphonium sulfonium ions are preferred in the present invention, because these are devoid of antimony, which is a toxic substance, and are safely usable.

The adhesive may contain the photoacid generator in an amount (proportion) of typically about 0.01 to about 0.1 part by weight, preferably 0.03 to 0.5 part by weight, and particularly preferably 0.05 to 0.1 part by weight, per 1 part by weight of the compound (A).

Surfactant

The adhesive according to the present invention preferably contains a surfactant in an amount of 0.01 to 1 weight percent of the totality of the adhesive, because the resulting adhesive less causes crawling upon application thereof and can form a more uniform coat layer. The surfactant for use herein may be selected from F-444, F-447, F-554, F-556, and F-557 (trade names, fluorine-containing oligomers, from DIC Corporation); BYK-350 (trade name, an acrylic polymer, from BYK-Chemie GmbH); and A-1420, A-1620, and A-1630 (trade names, fluorine-containing alcohols, from Daikin Industries Ltd.). The adhesive may contain each of different types of them alone or in combination.

Solvent

The adhesive according to the present invention preferably contains a solvent for controlling its viscosity. The adhesive may contain each of different types of conventionally known solvents alone or in combination. Non-limiting examples of the solvents include toluene, hexane, isopropanol, methyl isobutyl ketone, cyclopentanone, cyclohexanone, propylene glycol monomethyl ether acetate, propylene glycol monomethyl ether, and γ-butyrolactone.

The adhesive according to the present invention can be prepared by formulating the components and, as needed, other components and stirring and mixing them, where necessary, with debubbling (degassing) in a vacuum. The stirring and mixing is preferably performed at a temperature of about 10° C. to about 80° C. The stirring and mixing may employ a known or common device which is exemplified typically by planetary centrifugal mixers, single-screw or multi-screw extruders, planetary mixers, kneaders, and dissolvers.

The adhesive according to the present invention has a viscosity of typically about 30 to about 2000 mPa·s, preferably 300 to 1500 mPa·s, and particularly preferably 500 to 1500 mPa·s, as determined at 25° C. and a shear rate of 50 $s^{-1}$. The adhesive therefore has excellent coatability and can be applied uniformly onto the adherend.

The heat treatment of the adhesive according to the present invention after the application to the adherend allows vinyl ether groups of the compound (A) to bond to at least one of hydroxy group and carboxy group of the compound (B) through acetal bonding, to thereby form a polymer that has a high softening point and offers excellent adhesiveness.

For example, assume that the adhesive contains a compound represented by Formula (a') as the compound (A), and a compound including constitutional units represented by Formula (b') as the compound (B). This adhesive, when subjected to a heat treatment, gives a polymer represented by Formula (1):

[Chem. 13]

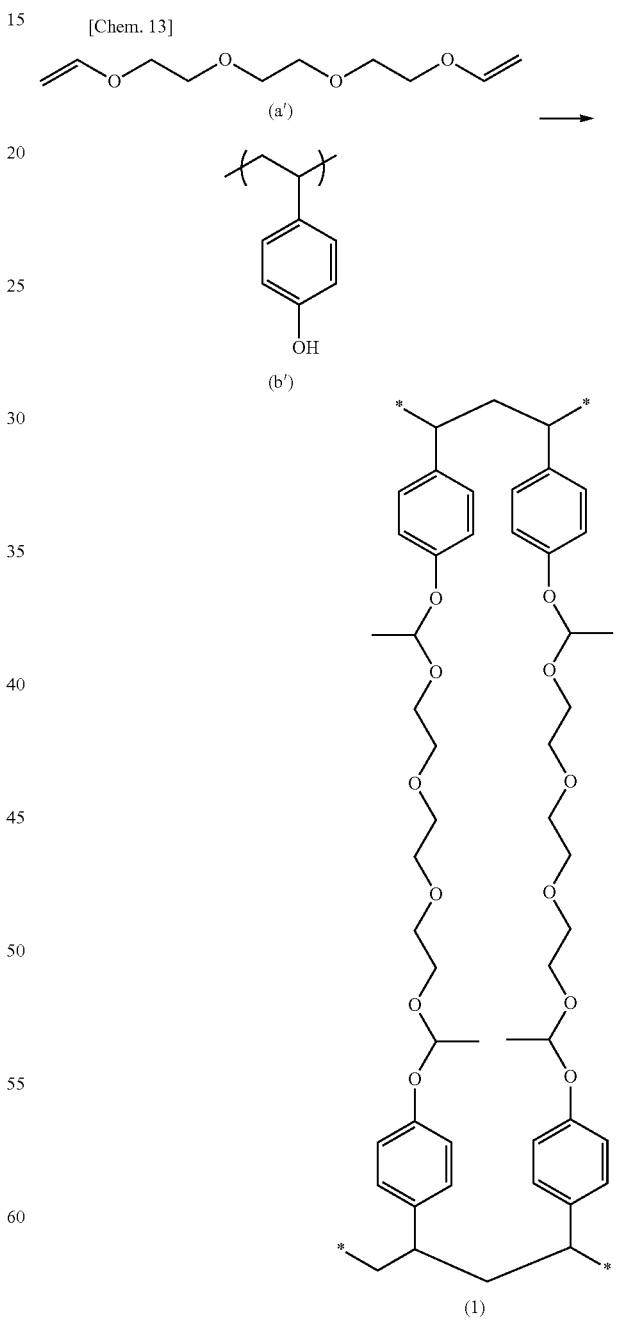

The polymer resulting from the heat treatment of the adhesive according to the present invention can have a softening point as controlled by adjusting the proportion of the compound (A) to be reacted to form acetal bonding with the compound (B). Assume that the adhesive according to the present invention is used as a temporary adhesive; and that the permanent adhesive to be used in combination with the temporary adhesive has a thermal curing temperature of 120° C. In this case, the polymer is preferably a thermoplastic resin having a softening point of typically 130° C. or higher (for example 130° C. to 170° C., and particularly preferably 140° C. to 160° C.)

The polymer and the thermoplastic resin (C), when heated at a temperature equal to or higher than their softening points, are abruptly softened or liquefied and have lower adhesiveness or lose adhesiveness.

Assume that the adhesive according to the present invention contains an acid generator; and that an acid is generated by the application of heat or light after the polymerization. The polymer in this case is decomposed at acetal bonding sites to give low-molecular-weight products (i.e., decomposed products) having lower softening points (typically 50° C. to 150° C., preferably 60° C. to 120° C., and particularly preferably 80° C. to 100° C.) as compared with the polymer before decomposition. The resulting decomposed products can be softened or liquefied by heating at a temperature lower than the softening point of the polymer before decomposition.

Assume that the adhesive according to the present invention is used as a temporary adhesive; and that the permanent adhesive to be used in combination with the temporary adhesive has a thermal curing temperature of 120° C. In this case, the temperature at which the adhesive after formation of the polymer is softened or liquefied (namely, softening point) is typically 130° C. or higher (for example, 130° C. to 170° C., and particularly preferably 140° C. to 160° C.)

The softening point of the adhesive can be measured by a method described in working examples. The softening points of the compound (A), the compound (B), and the thermoplastic resin (C) can be measured using a Koka flow tester under flow conditions as follows:

Flow Conditions
  Pressure: 100 kg/dm$^2$
  Speed: 6° C./min.
  Nozzle: 1 mm in diameter by 10 mm The composition resulting from heating, whereby softening or liquefying, the adhesive after formation of the polymer is easily soluble in one or more types of solvents such as cyclohexanone, propylene glycol monomethyl ether, propylene glycol monomethyl ether acetate, acetone, ethyl acetate, butyl acetate, and methyl isobutyl ketone. The composition, when deposited on the adherend after debonding (namely, when an adhesive residue is left), can be easily removed by washing away using one or more types of the solvents.

The adhesive according to the present invention, when subjected to a heat treatment, can form a polymer having a high softening point. The adhesive can therefore keep on firmly securing and holding an adherend even in a high-temperature environment, as long as being at a temperature lower than the softening point of the polymer. In addition, the solidified product of the adhesive resists spontaneous debonding and cracking and can keep on securing and holding the adherend even in an environment with abrupt temperature change. When the securing (protecting) of the adherend becomes unnecessary, the polymer and the thermoplastic resin (C), by subjecting to a heat treatment at a temperature equal to or higher than the softening points of the polymer and the thermoplastic resin (C), can be abruptly softened or liquefied to have lower adhesiveness or to lose adhesiveness, where, when the adhesive according to the present invention contains an acid generator, the term "the polymer" is read as "the decomposed product of the polymer". This allows the adhesive according to the present invention to be advantageously usable as an adhesive for temporarily securing a fragile adherend.

Method for Temporarily Securing Adherend

The method according to the present invention for temporarily securing an adherend is a method for temporarily securing an adherend to a support using an adhesive. The method includes a securing step and a debonding step. In the securing step, the above-mentioned adhesive is subjected to a heat treatment to form a polymer between the compound (A) and the compound (B) each contained in the adhesive, and the adhesive is then solidified to secure the adherend to the support. In the debonding step, the solidified adhesive is subjected to a heat treatment at a temperature equal to or higher than the softening point of the polymer to soften or liquefy the adhesive to thereby debond the adherend from the support.

The heating for polymerization of the compound (A) and the compound (B) in the adhesive may be performed at a temperature of typically about 100° C. to about 300° C., and preferably 100° C. to 250° C. Within the temperature range, the heating may be performed at a constant, maintained temperature, or at different temperatures changing stepwise. The heating may be performed for a time of typically about 30 seconds to about 30 minutes, and preferably 3 minutes to 12 minutes. The heating, if performed at a temperature lower than the range and/or for a time shorter than the range, tends to cause the adhesive to less satisfactorily maintain its adhesiveness in a high-temperature environment, because the resulting polymer has a lower weight-average molecular weight and a lower softening point. On the other hand, the heating, if performed at a temperature higher than the range and/or for a time longer than the range, may cause the adherend, for example, to be less effectively washed away after debonding and may disadvantageously cause lower productivity, because the resulting polymer has a lower softening point due to occurrence of side reactions, or has an excessively high softening point due to polymerization more than necessary.

After the formation of the polymer, the solidification of the adhesive is performed by cooling down to a temperature lower than the softening points of the formed polymer and the thermoplastic resin (C).

The heat treatment in the securing step is preferably performed with pressing the adherend to the support at an adequate pressure (for example, about 300 to about 5000 g/dm$^2$). This is preferred for still firmer securing.

The securing step can be performed either in the air or in a vacuum.

Non-limiting examples of embodiments of the securing step include embodiments 1 to 3 as follows.

In the embodiment 1, the adherend and the support are laid over each other through the adhesive, the resulting article is heated to allow the compound (A) and the compound (B) in the adhesive to form a polymer to thereby bond the adherend and the support to each other, and the adhesive is then solidified to secure the adherend to the support.

In the embodiment 2, the adhesive is applied onto at least one of the adherend and the support, then heated to allow the compound (A) and the compound (B) in the adhesive to form a polymer, the adhesive is then solidified to form an adhesive film, the adherend and the support are laid over each other through the adhesive film, and the adhesive film is softened to bond and secure the adherend to the support.

In the embodiment 3, the adhesive is applied to a carrier other than the adherend and the support, and heated to allow the compound (A) and the compound (B) in the adhesive to form a polymer, the adhesive is then solidified to form an adhesive film, the adherend and the support are laid over each other through the adhesive film, and the adhesive film is softened to bond and secure the adherend to the support.

In the embodiments 2 and 3, the softening of the solidified adhesive film may be performed typically by heating at a temperature of typically 170° C. to 250° C. (preferably 190° C. to 230° C.) for a time of typically about 0.5 to about 10 minutes (preferably 1 to 5 minutes).

In particular, the adherend is preferably bonded and secured to the support according to the embodiment 2 in the method according to the present invention for temporarily securing an adherend. Specifically, the method according to the present invention for temporarily securing an adherend is preferably a method for temporarily securing an adherend to a support using an adhesive, where the method includes the following steps a), b), and c). In the step a), the adhesive is applied at least one of the adherend and the support, the applied adhesive is subjected to a heat treatment to form a polymer between the compound (A) and the compound (B) each contained in the adhesive, and the adhesive is solidified to form an adhesive film. In the step b), the adherend and the support are laid over each other through the adhesive film, and the adhesive film is then softened to bond and secure the adherend to the support. In the step c), the adhesive film is subjected to a heat treatment to be softened or liquefied, and thereby the adherend is debonded from the support (debonding step).

In the debonding step, the heating to soften or liquefy the polymer may be performed at any temperature as long as being equal to or higher than the softening point of the polymer. For example, assume that the polymer has a softening point of 140° C. to 160° C. In this case, the heating may be performed at a temperature of typically about 170° C. to about 250° C., and preferably 180° C. to 230° C., for a time of typically about 30 seconds to about 15 minutes, and preferably 3 minutes to 5 minutes. As used herein, the term "soften or liquefy" refers to reduction of the viscosity of the polymer to 100 Pa·s or less (preferably 1 Pa·s or less).

Assume that the adhesive according to the present invention contains an acid generator. In this case, the adherend can be debonded at a temperature lower than the softening point of the polymer, by previously decomposing the polymer with an acid into low-molecular-weight products.

For example, when the adhesive contains a photoacid generator as the acid generator, light application is preferably performed before the heat treatment. As the light, luminous rays with various wavelengths (such as ultraviolet rays and X rays) can be used, of which far-ultraviolet rays with a wavelength of 400 nm or less are preferably employed. The light application may be performed at an energy of typically about 500 to about 8000 mJ/cm². The heating in the heat treatment after the light application may be performed at a temperature of typically about 50° C. to about 160° C., and preferably 100° C. to 150° C., for a time of typically about 30 seconds to about 30 minutes, and preferably 3 minutes to 5 minutes.

When the adhesive contains a thermal acid generator as the acid generator, the heating in the heat treatment may be performed at a temperature of typically about 50° C. to about 160° C., and preferably 100 pc to 150° C., for a time of typically about 30 seconds to about 15 minutes, and preferably 3 minutes to 5 minutes.

Non-limiting examples of the technique (coating technique) for use herein to apply the adhesive include well-known, common techniques such as curtain coating, squeegee coating, roll coating, spray coating, brush coating, bar coating, roller coating, silk-screen printing, and spin coating.

The thickness of the coated adhesive can be adjusted as appropriate according to the intended use. For example, when the adhesive is used for bonding a semiconductor wafer to a support, the thickness is about 1 to about 20 μm.

When an adhesive residue is left on the adherend, the method according to the present invention for temporarily securing an adherend preferably further includes, after the debonding step, a washing treatment with a solvent. In particular, when temporary securing is performed using an adhesive containing an antioxidant, the adhesive residue can be extremely easily washed away in the debonding step.

The method according to the present invention for temporarily securing an adherend employs the adhesive and can thereby protect the adherend by bonding and securing the adherend to a support, even when the adherend is a thin-film, breakable adherend. Non-limiting examples of the thin-film, breakable adherend include semiconductor wafers (such as silicon wafers), optical glass, films, metal sheets, and ceramic sheets. In addition, the method can keep on securing the adherend even in a high-temperature environment and in an environment with abrupt temperature change. When the protection becomes unnecessary, the adherend can be debonded without breakage and without adhesive residue.

Adhesive Film

The adhesive film according to the present invention includes the polymer between the compound (A) and the compound (B), and the thermoplastic resin (C). The adhesive film according to the present invention may result typically from applying the adhesive, subjecting the applied adhesive to a heat treatment, and subsequently solidifying the resulting adhesive. The application, heat treatment, and solidification of the adhesive may be performed by the techniques described in the method for temporarily securing an adherend.

An object to which the adhesive is applied is not limited and is exemplified typically by the adherend, the support, and a carrier other than the adherend and the support.

The thickness of the adhesive film can be adjusted as appropriate according to the intended use. For example, when the adhesive film is used for bonding a semiconductor wafer to a support, the thickness is about 1 to about 20 μm.

The adhesive film according to the present invention includes the polymer between the compound (A) and the compound (B) and can thereby bond/secure the adherend while maintaining high adhesiveness, even in a high-temperature environment. In addition, the adhesive film according to the present invention includes the thermoplastic resin (C) in combination with the polymer, thereby has excellent flexibility, resists spontaneous debonding and cracking, and can maintain excellent adhesiveness, even in an environment with abrupt temperature change. The adhesive film according to the present invention, when heated at a temperature equal to or higher than the softening points of the polymer and the thermoplastic resin (C), is abruptly softened or liquefied to have lower adhesiveness or to lose adhesiveness. Accordingly, the adhesive film according to the present invention is advantageously usable for temporarily securing a thinned semiconductor chip.

Method for Processing Adherend

The method according to the present invention for processing an adherend is a method for processing an adherend that is temporarily secured to a support using the adhesive according to the present invention. The method includes a securing step, a processing step, and a debonding step. In the securing step, the adhesive is subjected to a heat treatment to form a polymer between the compound (A) and the compound (B) each contained in the adhesive, and the adhesive is then solidified to secure the adherend to the support. In the processing step, the secured adherend is subjected to a processing. In the debonding step, the solidified adhesive is subjected to a heat treatment at a temperature equal to or higher than the softening point of the polymer to soften or liquefy the adhesive to thereby debond the adherend from the support.

When an adhesive containing a photoacid generator is used as the adhesive, the method preferably further includes light application before the heat treatment in the debonding step.

The securing step and the debonding step can be performed by procedures as in the method for temporarily securing an adherend. When an adhesive residue is left on the adherend, the method preferably further includes a washing treatment with a solvent, after the debonding step. The washing treatment can also be performed by a procedure as in the method for temporarily securing an adherend.

The processing step is the step of processing the adherend. For example, when the adherend is a silicon wafer, this step is the step of subjecting the adherend typically to grinding (thinning) and/or etching. According to the present invention, the adherend is processed while being secured to the support using the adhesive. This can eliminate or minimize the breakage of the adherend in the processing step and in a subsequent transporting step even when the adherend is ground very thin. The adhesive according to the present invention, when subjected to a heat treatment, can form a polymer having a high softening point. Thus, the adhesive can keep on holding or securing the adherend to the support and eliminate or minimize the breakage of the adherend even in a high-temperature environment and in an environment with abrupt temperature change, as long as the temperature being lower than the softening point of the polymer.

EXAMPLES

The present invention will be illustrated in further detail with reference to several examples below. It should be noted, however, that the examples are by no means intended to limit the scope of the present invention.

As the viscosity of a sample adhesive, a shear viscosity was calculated using a Rheometer MCR 301 (trade name, supplied by Anton Paar GmbH) at 25° C. and a shear rate of 50 s$^{-1}$.

The application of the adhesive was performed using a spin coater ACT-400AII (trade name, supplied by ACTIVE Co., Ltd.).

Heating was performed using a hot plate ND-1 (supplied by AS ONE Corporation).

Examples 1 to 12 and Comparative Example 1

Adhesives were prepared by formulating and mixing components according to the formulae (in part by weight) given in a table below. The adhesives were used in evaluations as follows.

Evaluation Methods

1. Flexibility 1-1: Presence or Absence of Spontaneous Debonding by Cooling

A tested adhesive (0.1 g) was applied onto a silicon wafer (4 inches in diameter) to a thickness of 10 μm. The silicon wafer was then cut to a piece of a size of 1.5 cm by 1.5 cm, laid on a glass plate of the same size, heated at 140° C. for 2 minutes, heated at 200° C. for 2 minutes, further heated at 230° C. for 4 minutes (heat treatment), and yielded a multilayer assembly including the silicon wafer, the adhesive, and the glass plate disposed in the specified sequence. The prepared multilayer assembly was left stand at 25° C. for 0.5 hour, whether spontaneous debonding occurred between the silicon wafer and the glass plate was visually observed, and an evaluation was made according to the following criteria:

Evaluation Criteria

Good: no spontaneous debonding occurred; and

Poor: spontaneous debonding occurred.

1-2: Presence or Absence of Cracking by Cooling

A tested adhesive was applied onto a silicon wafer by coating at 800 rpm for 10 seconds, and at 1500 prm for 30 seconds, this was heated at 140° C. for 2 minutes, heated at 200° C. for 2 minutes, and further heated at 230° C. for 4 minutes, and yielded a sample. The prepared sample was left stand at an ambient temperature of 25° C. for 0.5 hour, whether cracking occurred was visually observed, and an evaluation was made according to the following criteria:

Evaluation Criteria

Good: no cracking occurred; and

Poor: cracking occurred.

1-3: Adhesion Evaluation by Cross-Cut Test

A sample prepared by a procedure similar to that in 1-2 was cut in using a box cutter to form 25 cross cuts, subjected to a cellophane tape peeling test (in accordance with JIS 5600), and whether or how the coated adhesive layer was separated was visually observed, and an evaluation was made according to the following criteria:

Evaluation Criteria

Class 0: the cut lines had smooth edges without separation;

Class 1: there was little separation at an intersection between cut lines, apparently not greater than 5%;

Class 2: there was separation at intersections along cut lines, from 5% to less than 15%;

Class 3: the coat layer was partially or entirely separated along cut lines, from 15% to less than 35%.

2. Softening Point

A tested adhesive (0.1 g) was applied onto a glass plate (1) to a thickness of 10 μm, another glass plate (2) was laid thereon, heated at 140° C. for 2 minutes, heated at 200° C. for 2 minutes, further heated at 230° C. for 4 minutes, and yielded a multilayer assembly including the glass plate (1), the adhesive, and the glass plate (2) disposed in the specified sequence.

For the prepared multilayer assembly, the glass plate (1) was pulled in the horizontal direction with stress of 2 kg while the glass plate (2) was secured and while the assembly was heated. During this, the temperature at which the glass plate (1) started moving was determined, and this was defined as the softening point.

3. Slide Debonding Ability

A multilayer assembly including the glass plate (1), the adhesive, and the glass plate (2) disposed in the specified sequence was prepared by a procedure similar to that in "2. Softening Point", was heated at 220° C. for 15 minutes, and subjected to a test in which one of the two glass plates was slid at a load of 2 kg while the other glass plate was secured, and an evaluation was made according to the following criteria:

Evaluation Criteria

Good: the glass plate could be debonded; and

Poor: the glass plate could not be debonded.

4. Washability

Ethyl acetate was freely flown onto the glass plate debonded in "3. Slide Debonding Ability", whether an adhesive residue was left was visually observed, and an evaluation was made according to the following criteria:

Evaluation Criteria

Very good (VG): the glass plate could be washed or cleaned without adhesive residue within 30 seconds from the beginning of free-flowing of the solvent;

Good: the glass plate could be washed without adhesive residue after the elapse of time longer than 30 seconds from the beginning of free-flowing of the solvent; and Fair: the glass plate could be washed in an area of 80% or more, but there partially remained an adhesive residue.

The Abbreviations in the Table Stand for Compounds as Follows:

Compound (A)

TEG-DVE: triethylene glycol divinyl ether

Compound (B)

CST-50: a p-hydroxystyrene/styrene copolymer (mole ratio: 50/50, weight ratio: 46/54), having a weight-average molecular weight of 4400 as determined by GPC and calibrated with a polystyrene standard and a softening point of 150° C., trade name Marukalinker CST-50, supplied by Maruzen Petrochemical Co., Ltd.

Thermoplastic Resin (C)

KS-1: a poly(vinyl butyral) resin, having a molecular weight: $2.7 \times 10^4$ and a softening point of 200° C., trade name S-LEC KS-1, supplied by Sekisui Chemical Co., Ltd.

KS-10: a poly(vinyl butyral) resin, having a molecular weight of $1.7 \times 10^4$ and a softening point of 200° C., trade name S-LEC KS-10, supplied by Sekisui Chemical Co., Ltd.

PCL H-1P: a polycaprolactone, having a weight-average molecular weight of 10000 as determined by GPC and

TABLE 1

| | | | Examples | | | | | | |
|---|---|---|---|---|---|---|---|---|---|
| | | | 1 | 2 | 3 | 4 | 5 | 6 | 7 |
| (A) | | TEG-DVE | 0.24 | 0.24 | 0.24 | 0.24 | 0.24 | 0.24 | 0.24 |
| (B) | | CST-50 | 5.4 | 5.4 | 5.4 | 5.4 | 5.4 | 4.5 | 3.6 |
| (C) | | KS-1 | 1.8 | 1.8 | 1.8 | 1.8 | 1.8 | 2.7 | 3.6 |
| | | KS-10 | — | — | — | — | — | — | — |
| | | PCL H-1P | 1.8 | 1.8 | 1.8 | 1.8 | 1.8 | 1.8 | 1.8 |
| Polymerization promoter | | t-CA | 0.18 | 0.18 | 0.18 | 0.18 | 0.18 | 0.18 | 0.18 |
| Surfactant | | F-554 | 0.045 | 0.045 | 0.045 | 0.045 | 0.045 | 0.045 | 0.045 |
| Antioxidant | | In1010 | | 0.09 | 0.27 | 0.45 | 0.9 | 0.45 | 0.45 |
| Solvent | | CHO | 22 | 22 | 22 | 22 | 22 | 22 | 22 |
| Adhesive viscosity (mPa · s) | | | — | — | — | — | — | — | — |
| Vinyl ether group (mole) in (A) per mole of hydroxy group in (B) | | | 0.0978 | 0.0978 | 0.0978 | 0.0978 | 0.0978 | 0.1173 | 0.1476 |
| Evaluation results | Flexibility | Spontaneous debonding | Good | Good | Good | Good | Good | Good | Good |
| | | Cracking | Good | Good | Good | Good | Good | Good | Good |
| | | Cross cut test | 2 | 2 | 2 | 2 | 2 | 2 | 1 |
| | Softening point (° C.) | | 130 | 130 | 130 | 130 | 130 | 135 | 130 |
| | Slide debonding ability | | Good | Good | Good | Good | Good | Good | Good |
| | Washability | | Fair | Good | Good | VG | VG | VG | VG |

| | | | Examples | | | | | Comparative Example |
|---|---|---|---|---|---|---|---|---|
| | | | 8 | 9 | 10 | 11 | 12 | 1 |
| (A) | | TEG-DVE | 0.24 | 0.24 | 0.24 | 0.24 | 0.24 | 0.24 |
| (B) | | CST-50 | 3.6 | 3.6 | 3.6 | 7.2 | 5.4 | 9.0 |
| (C) | | KS-1 | — | — | — | 1.8 | — | — |
| | | KS-10 | 3.6 | 3.6 | 2.7 | — | — | — |
| | | PCL H-1P | 1.8 | 1.8 | 2.7 | — | 3.6 | — |
| Polymerization promoter | | t-CA | 0.18 | 0.18 | 0.18 | 0.18 | 0.18 | 0.18 |
| Surfactant | | F-554 | 0.045 | 0.045 | 0.045 | 0.045 | 0.045 | 0.045 |
| Antioxidant | | In1010 | 0.45 | 0.72 | 0.72 | — | — | — |
| Solvent | | CHO | 22 | 20 | 18 | 22 | 22 | 10 |
| Adhesive viscosity (mPa · s) | | | 854 | 1251 | 1191 | — | — | — |
| Vinyl ether group (mole) in (A) per mole of hydroxy group in (B) | | | 0.1476 | 0.1476 | 0.1476 | 0.0773 | 0.978 | 0.0587 |
| Evaluation results | Flexibility | Spontaneous debonding | Good | Good | Good | Good | Good | Poor |
| | | Cracking | Good | Good | Good | Good | Good | Poor |
| | | Cross cut test | 1 | 1 | 0 | 3 | 3 | 3 |
| | Softening point (° C.) | | 130 | 130 | 120 | 160 | 100 | 160 |
| | Slide debonding ability | | Good | Good | Good | Good | Good | Good |
| | Washability | | VG | VG | VG | Fair | Good | Fair | calibrated with a polystyrene standard and a softening point of 100° C., trade name PLACCEL HIP, supplied by Daicel Corporation Other Components t-CA: trans-cinnamic acid, a polymerization promoter, having a pKa of 4.44, supplied by Wako Pure Chemical Industries, Ltd.

F-554: a fluorine-containing oligomer, a surfactant, trade name F-554, supplied by DIC Corporation In1010: pentaerythritol tetrakis(3-(3,5-di-t-butyl-4-hydroxyphenyl)propionate), a phenolic antioxidant, trade name Irganox 1010, supplied by BASF SE CHO: cyclohexanone, a solvent

INDUSTRIAL APPLICABILITY

The adhesive according to the present invention is advantageously usable as an adhesive for temporarily securing a fragile adherend and, in particular, preferably usable as an adhesive for temporary securing (temporary adhesive) in a production process of thinned semiconductor chips.

The invention claimed is:

1. An adhesive comprising:
   (A) a multivalent vinyl ether compound;
   (B) a compound including two or more of a constitutional unit represented by Formula (b); and
   (C) a thermoplastic resin,
   Formula (b) expressed as follows:

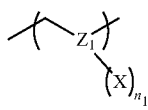

(b)

wherein $Z_1$ represents a group resulting from removing $(n_1+2)$ hydrogen atoms from a structural formula of a compound selected from a saturated or unsaturated aliphatic hydrocarbon, a saturated or unsaturated alicyclic hydrocarbon, an aromatic hydrocarbon, a heterocyclic compound, and a compound including two or more of these compounds bonded to each other through a single bond or a linkage group; X is, independently in each occurrence, selected from hydroxy and carboxy; and $n_1$ represents an integer of 1 or more, where $n_1$ occurrences of X may be identical to or different from each other,
wherein the thermoplastic resin (C) is at least one compound selected from the group consisting of:
poly(vinyl acetal) resins; and
polyester resins.

2. The adhesive according to claim 1,
wherein the multivalent vinyl ether compound (A) is a compound represented by Formula (a):

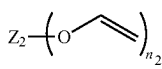

(a)

wherein $Z_2$ represents a group resulting from removing $n_2$ hydrogen atoms from a structural formula of a compound selected from a saturated or unsaturated aliphatic hydrocarbon, a saturated or unsaturated alicyclic hydrocarbon, an aromatic hydrocarbon, a heterocyclic compound, and a compound including two or more of these compounds bonded to each other through a single bond or a linkage group; and $n_2$ represents an integer of 2 or more.

3. The adhesive according to claim 2,
wherein the compound (B) has a weight-average molecular weight of 1500 or more as determined by GPC and calibrated with a polystyrene standard.

4. The adhesive according to claim 2,
wherein the thermoplastic resin (C) has a weight-average molecular weight of 1500 or more as determined by GPC and calibrated with a polystyrene standard.

5. The adhesive according to claim 2,
wherein the multivalent vinyl ether compound (A) is present in such an amount that an amount of vinyl ether group in the multivalent vinyl ether compound (A) is 0.01 to 10 moles per mole of the totality of hydroxy group and carboxy group in the compound (B),
wherein the thermoplastic resin (C) is present in an amount of 0.1 to 3 parts by weight per 1 part by weight of the compound (B), and
wherein the multivalent vinyl ether compound (A), the compound (B), and the thermoplastic resin (C) are present in combination in a total content of 70 to 99.9 weight percent of a totality of non-volatile components in the adhesive.

6. The adhesive according to claim 1,
wherein the compound (B) has a weight-average molecular weight of 1500 or more as determined by GPC and calibrated with a polystyrene standard.

7. The adhesive according to claim 6,
wherein the thermoplastic resin (C) has a weight-average molecular weight of 1500 or more as determined by GPC and calibrated with a polystyrene standard.

8. The adhesive according to claim 6,
wherein the multivalent vinyl ether compound (A) is present in such an amount that an amount of vinyl ether group in the multivalent vinyl ether compound (A) is 0.01 to 10 moles per mole of the totality of hydroxy group and carboxy group in the compound (B),
wherein the thermoplastic resin (C) is present in an amount of 0.1 to 3 parts by weight per 1 part by weight of the compound (B), and
wherein the multivalent vinyl ether compound (A), the compound (B), and the thermoplastic resin (C) are present in combination in a total content of 70 to 99.9 weight percent of a totality of non-volatile components in the adhesive.

9. The adhesive according to claim 1,
wherein the thermoplastic resin (C) has a weight-average molecular weight of 1500 or more as determined by GPC and calibrated with a polystyrene standard.

10. The adhesive according to claim 1,
wherein the multivalent vinyl ether compound (A) is present in such an amount that an amount of vinyl ether group in the multivalent vinyl ether compound (A) is 0.01 to 10 moles per mole of the totality of hydroxy group and carboxy group in the compound (B),
wherein the thermoplastic resin (C) is present in an amount of 0.1 to 3 parts by weight per 1 part by weight of the compound (B), and
wherein the multivalent vinyl ether compound (A), the compound (B), and the thermoplastic resin (C) are present in combination in a total content of 70 to 99.9 weight percent of a totality of non-volatile components in the adhesive.

11. The adhesive according to claim 1, further comprising at least one of a monovalent carboxylic acid represented by Formula (d) and a monohydric alcohol represented by Formula (e), Formulae (d) and (e) expressed as follows:

$$Z_3—COOH \quad (d)$$

wherein $Z_3$ represents a group resulting from removing one hydrogen atom from a structural formula of a compound selected from the group consisting of saturated or unsaturated aliphatic hydrocarbons, saturated or unsaturated alicyclic hydrocarbons, and aromatic hydrocarbons, each of which may have one or more substituents excluding carboxy, $$Z_4—OH \quad (e)$$

wherein $Z_4$ represents a group resulting from removing one hydrogen atom from a structural formula of an aromatic hydrocarbon which may have one or more substituents excluding hydroxy.

12. The adhesive according to claim 1, further comprising an antioxidant in an amount of 0.01 to 15 parts by weight per 100 parts by weight of a totality of the compound (B) and the thermoplastic resin (C).

13. An adhesive film comprising:
a polymer between:
   (A) a multivalent vinyl ether compound, and
   (B) a compound including two or more of a constitutional unit represented by Formula (b); and
   (C) a thermoplastic resin,
Formula (b) expressed as follows:

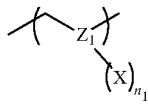

(b)

wherein $Z_1$ represents a group resulting from removing ($n_1$+2) hydrogen atoms from a structural formula of a compound selected from a saturated or unsaturated aliphatic hydrocarbon, a saturated or unsaturated alicyclic hydrocarbon, an aromatic hydrocarbon, a heterocyclic compound, and a compound including two or more of these compounds bonded to each other through a single bond or a linkage group; X is, independently in each occurrence, selected from hydroxy and carboxy; and $n_1$ represents an integer of 1 or more, where $n_1$ occurrences of X may be identical to or different from each other.

14. A method for temporarily securing an adherend to a support using an adhesive, the method comprising:
   a securing step of subjecting the adhesive according to claim 1 to a heat treatment to form a polymer between the multivalent vinyl ether compound (A) and the compound (B) each contained in the adhesive, and subsequently solidifying the adhesive to secure the adherend to the support; and
   a debonding step of subjecting the solidified adhesive to a heat treatment at a temperature equal to or higher than a softening point of the polymer to soften or liquefy the adhesive to thereby debond the adherend from the support.

15. A method for processing an adherend while being temporarily secured to a support using an adhesive, the method comprising:
   a securing step of subjecting the adhesive according to claim 1 to a heat treatment to form a polymer between the multivalent vinyl ether compound (A) and the compound (B) each contained in the adhesive, and subsequently solidifying the adhesive to secure the adherend to the support;
   a processing step of processing the secured adherend; and
   a debonding step of subjecting the solidified adhesive to a heat treatment at a temperature equal to or higher than the softening point of the polymer to soften or liquefy the adhesive to thereby debond the adherend from the support.

* * * * *